United States Patent
Yeh

(10) Patent No.: US 9,613,705 B1
(45) Date of Patent: Apr. 4, 2017

(54) METHOD FOR MANAGING PROGRAMMING MODE OF REWRITABLE NON-VOLATILE MEMORY MODULE, AND MEMORY STORAGE DEVICE AND MEMORY CONTROL CIRCUIT UNIT USING THE SAME

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/997,590

(22) Filed: Jan. 18, 2016

(30) Foreign Application Priority Data

Nov. 27, 2015 (TW) .............................. 104139615 A

(51) Int. Cl.
*G11C 16/14* (2006.01)
*G11C 16/10* (2006.01)
(52) U.S. Cl.
CPC .............. *G11C 16/14* (2013.01); *G11C 16/10* (2013.01)
(58) Field of Classification Search
CPC ......... G11C 16/14; G11C 16/10; G11C 16/12; G11C 7/24; G11C 5/141; G11C 5/148
USPC ............ 365/185.09, 185.02, 185.18, 185.05, 365/185.33
See application file for complete search history.

(56) References Cited

U.S. PATENT DOCUMENTS

| | | | |
|---|---|---|---|
| 8,201,785 B2* | 6/2012 | Goodman | F16M 11/14 248/181.1 |
| 8,289,771 B2* | 10/2012 | Tseng | G11C 11/5628 365/185.02 |
| 8,347,183 B2* | 1/2013 | Yoon | G06F 11/1068 714/752 |
| 8,514,819 B2* | 8/2013 | Tajima | H04W 36/02 370/336 |
| 8,902,671 B2* | 12/2014 | Ko | G11C 16/10 365/185.29 |
| 9,058,863 B2* | 6/2015 | Chen | G11C 7/222 |
| 9,086,854 B2* | 7/2015 | Liao | G06F 1/1681 |
| 9,141,530 B2* | 9/2015 | Yeh | G06F 12/0246 |
| 9,177,656 B2* | 11/2015 | Yeh | G11C 16/14 |
| 9,298,610 B2* | 3/2016 | Liang | G06F 12/0246 |
| 9,312,011 B1* | 4/2016 | Ko | G11C 16/14 |
| 9,324,435 B2* | 4/2016 | Chu | G11C 7/04 |
| 9,361,024 B1* | 6/2016 | Lin | G06F 12/0246 |
| 9,396,804 B1* | 7/2016 | Lin | G11C 16/10 |
| 9,418,731 B1* | 8/2016 | Watanabe | G11C 11/5635 |
| 9,430,325 B2* | 8/2016 | Liang | G06F 11/1068 |

(Continued)

*Primary Examiner* — Hien Nguyen
(74) *Attorney, Agent, or Firm* — Jianq Chyun IP Office

(57) ABSTRACT

In an exemplary embodiment, the method includes: determining whether a used capacity of first physical units initially configured to be programmed based on a first programming mode reaches a preset capacity and whether specific data stored in the first physical units matches a preset condition; and if the used capacity of the first physical units reaches the preset capacity and the specific data stored in the first physical units matches the preset condition, selecting at least one physical unit from second physical units initially configured to be programmed based on a second programming mode, and programming the selected physical unit based on the first programming mode. Accordingly, the writing speed decreased by the fully written buffer area may be improved.

33 Claims, 9 Drawing Sheets

(56) References Cited

U.S. PATENT DOCUMENTS

2016/0124679 A1* 5/2016 Huang ................. G06F 3/0647
                                                                711/103
2016/0232053 A1* 8/2016 Lin ...................... G06F 11/108

* cited by examiner

METHOD FOR MANAGING PROGRAMMING MODE OF REWRITABLE NON-VOLATILE MEMORY MODULE, AND MEMORY STORAGE DEVICE AND MEMORY CONTROL CIRCUIT UNIT USING THE SAME

CROSS-REFERENCE TO RELATED APPLICATION

This application claims the priority benefit of Taiwan application serial no. 104139615, filed on Nov. 27, 2015. The entirety of the above-mentioned patent application is hereby incorporated by reference herein and made a part of this specification.

BACKGROUND

Technical Field

The invention relates a memory management mechanism, and more particularly, to a data programming method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, in order to increase capacity of memory, one memory cell in certain types of memories may be used to store multiple bits of data. However, such kind of operating method may lead to decreases in a data storing speed of the memory. To avoid host terminals from noticing the delay, a buffer area having smaller capacity and faster storing speed is also arranged in some types of memories. In the buffer area, one memory cell is only capable of storing one bit of data, whereas one memory cell outside of the buffer area (e.g., a storage area) is capable of storing multiple bits of data. When data is received, the data will be temporarily stored into the buffer area and then moved into the storage area for storage at background, so that the host terminals can notice that the data has been stored rapidly.

Nonetheless, because the capacity of the buffer area is limited, the memory device often needs to automatically execute a data arrangement for the buffer area when the buffer area is fully written. Therefore, by fully writing the buffer area of a memory device, some kinds of memory speed testing programs can slow down the data storing speed of the memory device.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a data programming method, a memory storage device and a memory control circuit unit, which are capable of improving a decrease of a writing speed when a buffer area of a rewritable non-volatile memory module is fully written.

A data programming method for a rewritable non-volatile memory module is provided according to an exemplary embodiment of the invention. The rewritable non-volatile memory module includes a plurality of physical units. The physical units include a plurality of first physical units and a plurality of second physical units. The first physical units are configured initially to be programmed based on a first programming mode. The second physical units are configured initially to be programmed based on a second programming mode. The data programming method includes: receiving first data from a host system; determining whether a used capacity of the first physical units reaches a preset capacity; if the used capacity of the first physical units reaches the preset capacity, determining whether second data stored in the first physical units matches a preset condition, wherein the second data is valid data belonging to at least one first logical unit; and if the second data matches the preset condition, selecting at least one physical unit from the second physical units and programming the selected physical unit based on the first programming mode to store at least one part of data of the first data.

Another exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of physical units. The physical units include a plurality of first physical units and a plurality of second physical units. The first physical units are configured initially to be programmed based on a first programming mode. The second physical units are configured initially to be programmed based on a second programming mode. The memory control circuit unit is coupled to the connection interface unit and the rewritable non-volatile memory module. The memory control circuit unit is further configured to receive first data from the host system. The memory control circuit unit is further configured to determine whether a used capacity of the first physical units reaches a preset capacity. If it is determined the used capacity of the first physical units reaches the preset capacity, the memory control circuit unit is further configure to determine whether second data stored in the first physical units matches a preset condition. The second data is valid data belonging to at least one first logical unit. If it is determined that the second data matches the preset condition, the memory control circuit unit is further configured to select at least one physical unit from the second physical units and send a write command sequence which instructs to program the selected physical unit based on the first programming mode to store at least one part of data of the first data.

Another exemplary embodiment of the invention provides a memory control circuit unit, which is configured to control a rewritable non-volatile memory module. The rewritable non-volatile memory module includes a plurality of physical units. The physical units include a plurality of first physical units and a plurality of second physical units. The first physical units are configured initially to be programmed based on a first programming mode. The second physical units are configured initially to be programmed based on a second programming mode. The memory control circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is further configured to receive first data from the host system. The memory management circuit is further configured to determine whether a used capacity of the first physical units reaches a preset capacity. If it is determined that the used capacity of the first physical units reaches the preset capacity, the memory management circuit is further configure to determine whether second data stored in the first physical units matches a preset condition. The second data is valid data belonging to at least one first logical unit. If it is determined that the second data matches the preset condition, the memory management circuit is further configured to select at least one physical unit from the second physical units and send a write command sequence which instructs to program the selected physical unit based on the first programming mode to store at least one part of data of the first data.

Based on the above, after the write data is received, if the used capacity of the first physical units configured to be programmed based on the first programming mode reaches the preset capacity and the second data belonging to at least one logical unit stored in the first physical units matches the preset condition, at least one physical unit is selected from the physical units initially configured to be programmed based on the second programming mode and changed to be programmed based on the first programming mode to store the write data from the host system. Accordingly, a decrease of a writing speed may be improved when a buffer area of a rewritable non-volatile memory module is fully written.

To make the above features and advantages of the present disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
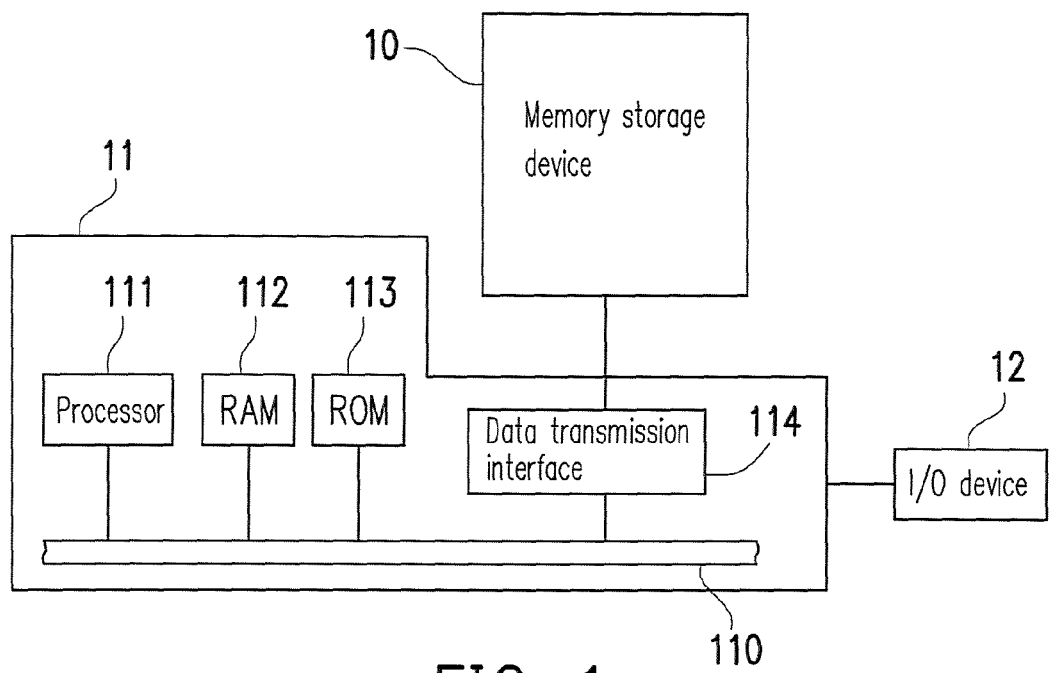
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so that the host system may write data into the memory storage device or read data from the memory storage device.

FIG. 1 is a schematic diagram illustrating a host system, a memory storage device and an I/O (input/output) device according to an exemplary embodiment of the invention.

Figure 2:
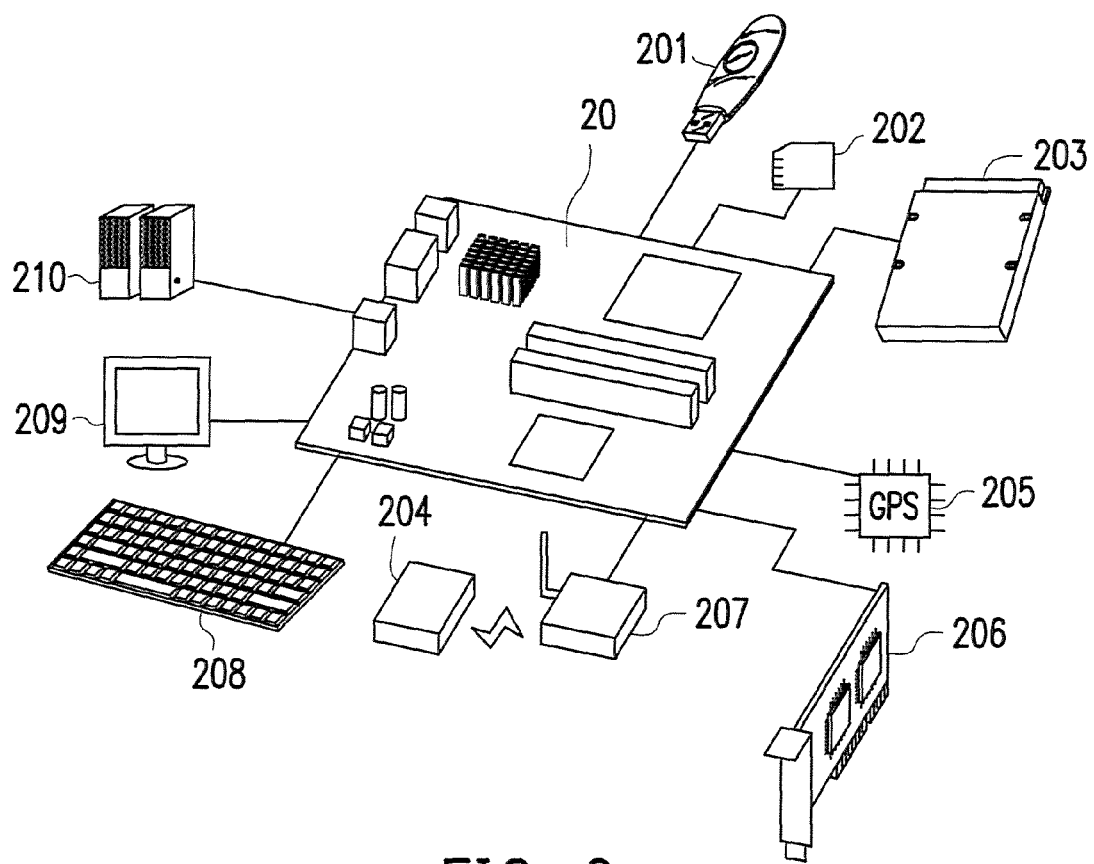
FIG. 2 is a schematic diagram illustrating a host system, a memory storage device and an I/O device according to another exemplary embodiment of the invention.

FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 111 is coupled to an I/O device 12 through the system bus 110. For example, the host system 11 can transmit output signals to the I/O device 12 or receive input signals from I/O device 12 through the system bus 110.

In this exemplary embodiment, the processor 111, the RAM 112, the ROM 113 and the data transmission interface 114 are disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 through the wireless transmission device 207.

Figure 3:
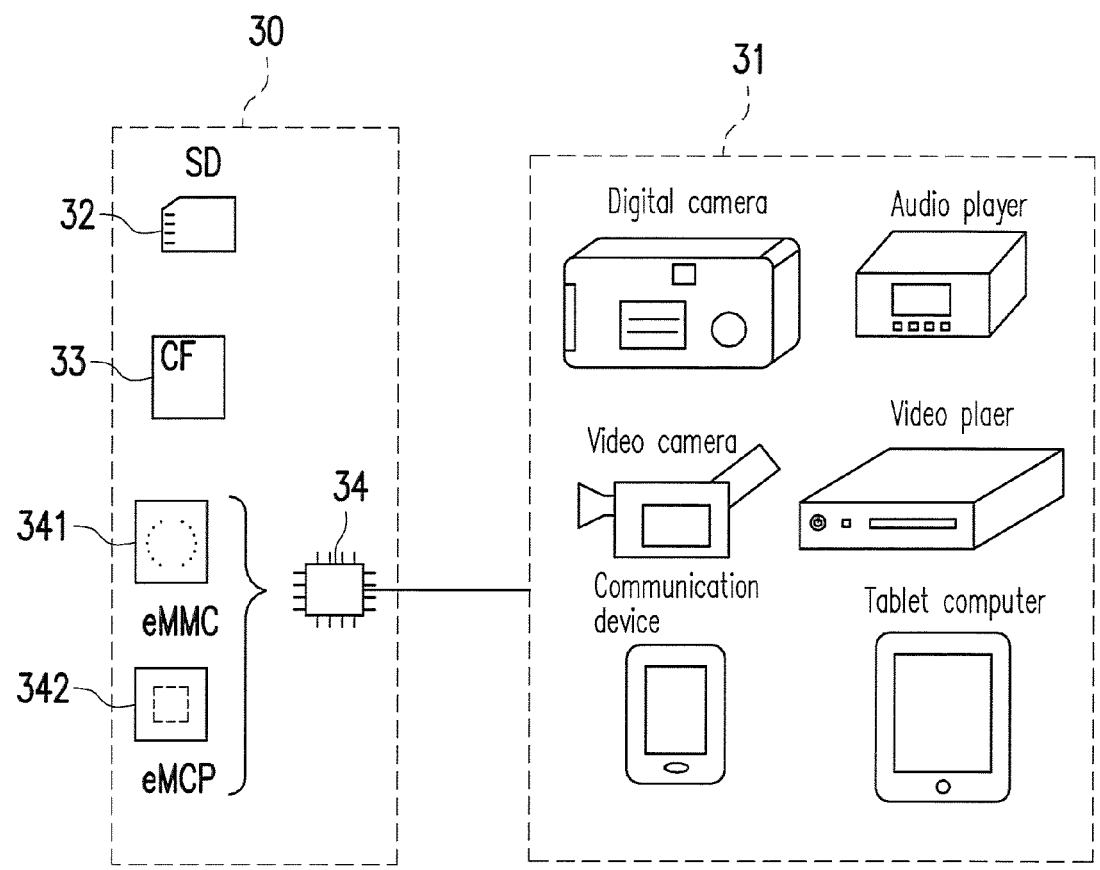
FIG. 3 is a schematic diagram illustrating a host system and a memory storage device according to another exemplary embodiment of the invention.

In an exemplary embodiment, aforementioned host system may be any systems capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage device 30 can be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module therein onto a substrate of the host system 31, such as an eMMC (Embedded Multimedia Card) 341 and/or an eMCP (embedded Multi Chip Package) 342.

Figure 4:
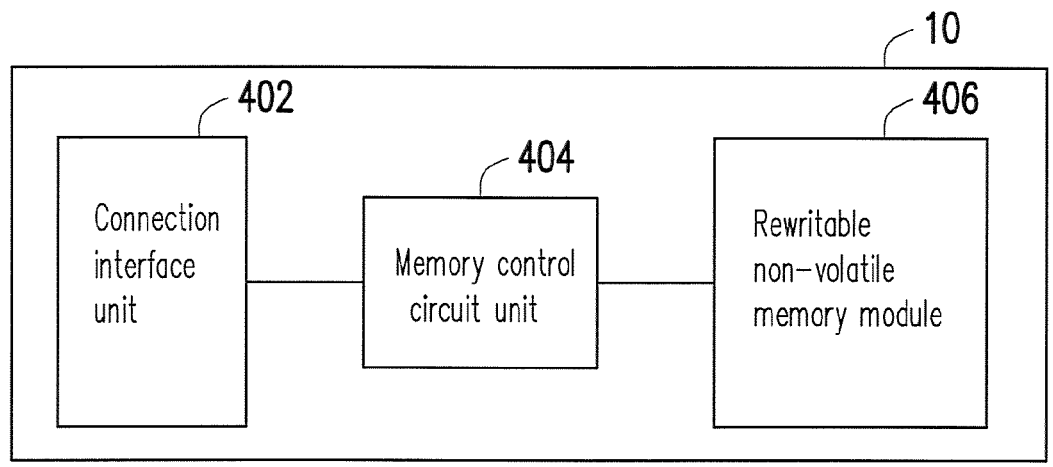
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

In this exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and execute operations of writing, reading or erasing data for the rewritable non-volatile memory module 406 according to commands from the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit of data in one memory cell), a MLC (Multi Level Cell) NAND flash memory module (i.e., a flash memory module capable of storing two bits of data in one memory cell), a TLC (Triple Level Cell) NAND flash memory module (i.e., a flash memory module capable of storing three bits of data in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate and thereby changing the threshold voltage of the memory cell. This process of changing the threshold voltage is also known as "writing data into the memory cell" or "programming the memory cell". Each of the memory cells in the rewritable non-volatile memory module 406 has a plurality of storage statuses depended on changes in the threshold voltage. The memory cell belongs to which of the storage statuses may be determined by applying a read voltage, so as to obtain the one or more bits stored in the memory cell.

Figure 5:
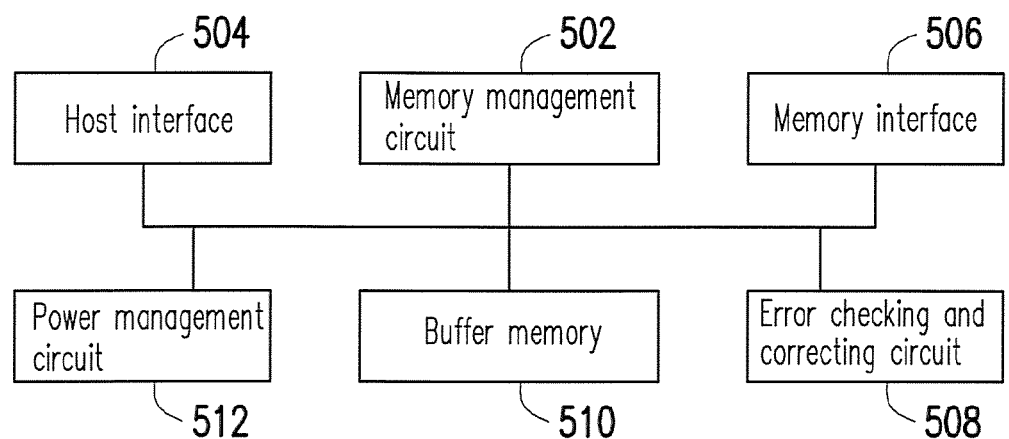
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands. During operations of the memory storage device 10, the control commands are executed to execute various operations such as writing, reading and erasing data. Hereinafter, description regarding operations of the memory management circuit 502 is equivalent to description regarding operations of the memory control circuit unit 404.

In this exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. During operations of the memory storage device 10, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Thereafter, the control commands are executed by the microprocessor unit to execute operations of writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes and instruct the rewritable non-volatile memory module 406 to perform the corresponding operations, such as writing, reading and erasing. In an exemplary embodiment, the memory management circuit 502 may further issue command sequence of other types to the rewritable non-volatile memory module 406 for instructing to execute the corresponding operations.

The host interface 504 is coupled to the memory management circuit 502 and configured to receive and identify commands and data sent from the host system 11. In other words, the commands and data sent from the host system 11 are passed to the memory management circuit 502 through the host interface 504. In this exemplary embodiment, the host interface 504 is compatible with the SATA standard. However, it should be understood that the present invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. That is, data to be written to the rewritable non-volatile memory module 406 is converted to a format acceptable to the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other command sequences for instructing to perform various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data stored in the bus. The signals or the data may include command codes and programming codes. For example, in a read command sequence, information such as identification codes and memory addresses are included.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to execute an error checking and correcting process to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Later, when the memory management circuit 502 reads the data from the rewritable non-volatile memory module 406, the corresponding ECC and/or the EDC are also read, and the error checking and correcting circuit 508 executes the error checking and correcting procedure on the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
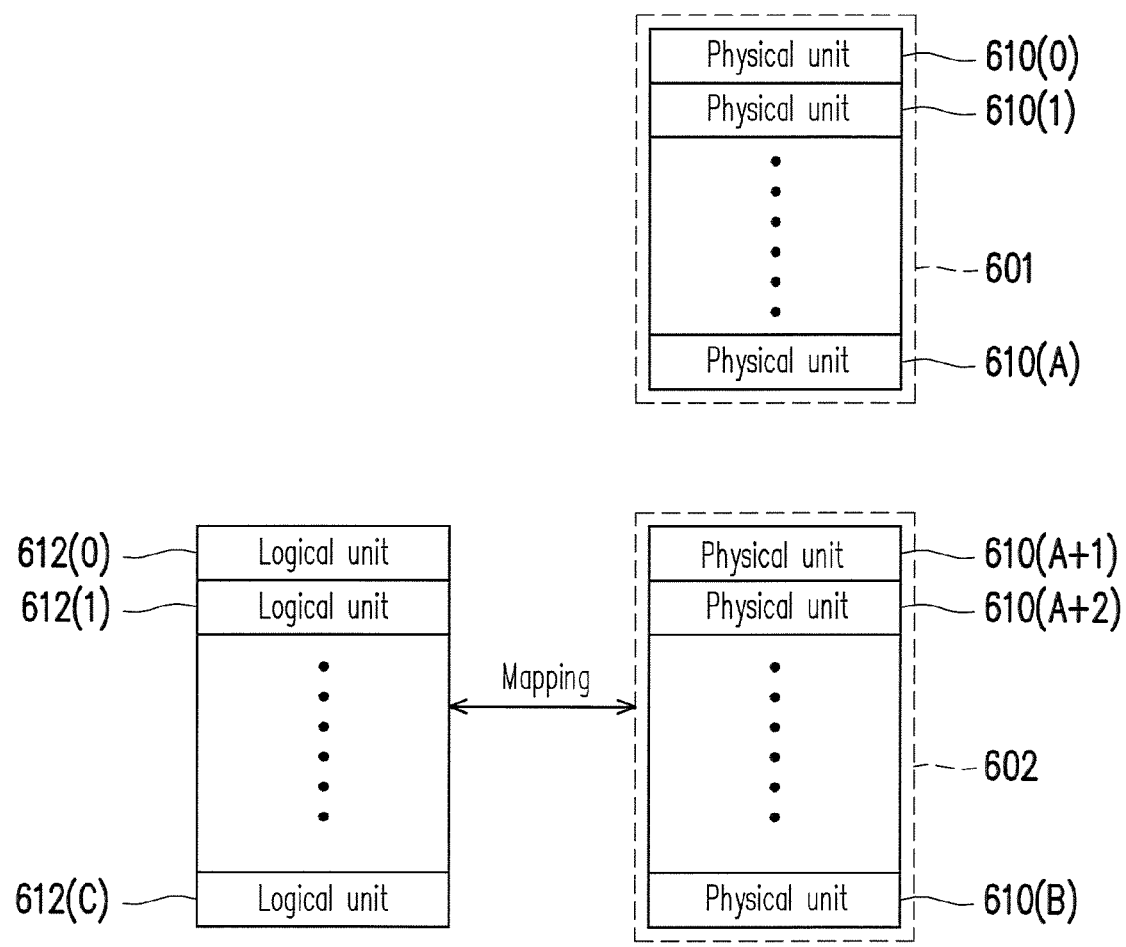
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. It should be understood that terms, such as "select" and "group", are logical concepts which describe operations in the physical units of the rewritable non-volatile memory module 406. That is to say, the physical units of the rewritable non-volatile memory module 406 are logically operated while actual locations of the physical units remain unchanged.

In this exemplary embodiment, the memory cells of the rewritable non-volatile memory module 406 constitute a plurality of physical programming units, and the physical programming units constitute a plurality of physical erasing units. For example, the memory cells on the same word line constitute one or more of the physical programming units. If each of the memory cells can store more than two bits of data, the physical programming units including such memory cells can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is a minimum unit for programming. That is, the programming unit is the minimum unit for writing data. For example, the physical programming unit is a physical page or a physical sector. When the physical programming units are the physical page, these physical programming units usually include a data bit area and a redundancy bit area, respectively. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

Referring to FIG. 6, the memory management circuit 502 logically groups the physical units 610(0) to 610(B) of the rewritable non-volatile memory module 406 into a plurality of areas such as a buffer area 601 and a storage area 602. In this exemplary embodiment, each of the physical units 610(0) to 610(B) refers to one or more physical erasing units. However, in another exemplary embodiment, each of the physical units 610(0) to 610(B) may also refer to one or more physical programming units or may be constituted by any number of memory cells.

Generally, data from host system 11 (i.e., the user data) is first temporarily stored into the physical units 610(0) to 610(A) belonging to the buffer area 601, and afterward moved into the physical units 610(A+1), 610(A+2) to 610(B) belonging to the storage area 602. In other words, only the physical units 610(A+1) to 610(B) belonging to the storage area 602 are regarded as final (or actually) storage locations of the user data.

The memory management circuit 502 configures (or sets) logical units 612(0) to 612(C) to be mapped to the physical units 610(A+1) to 610(B) in the storage area 602. For example, in this exemplary embodiment, the host system 11 accesses the data stored in the storage area 602 through a logical address (LA). Therefore, each of the logical units 612(0) to 612(C) refers to one logical address. However, in another exemplary embodiment, each of the logical units 612(0) to 612(C) may also refer to one logical programming unit, one logical erasing unit or a composition of a plurality of consecutive or non-consecutive logical addresses. In addition, each logical unit of the units 612(0) to 612(C) may also be mapped to one or more physical units.

The memory management circuit 502 records a mapping relation (also known as a logical-to-physical mapping relation) between the logical units and the physical units into at least one logical-to-physical mapping table. When the host system 11 intends to read the data from the memory storage device 10 or write the data into the memory storage device 10, the memory management circuit 502 may access the memory storage device 10 according to the logical-to-physical mapping table.

In this exemplary embodiment, the memory management circuit 502 configures the physical units 610(0) to 610(A) (hereinafter, also known as first physical units) belonging to the buffer area 601 initially (or only) to be programmed based on one specific programming mode (hereinafter, also known as a first programming mode) and configures the physical units 610(A+1) to 610(B) belonging to the storage area 602 (hereinafter, also known as second physical units) initially to be programmed based on another programming mode (hereinafter, also known as a second programming mode). A programming speed for programming one memory cell based on the first programming mode is higher than a programming speed for programming the memory cell based on the second programming mode. Moreover, a reliability of the data stored based on the first programming mode is often higher than a reliability of the data stored based on the second programming mode.

In this exemplary embodiment, the first programming mode refers to one of a single layer memory cell (SLC) mode, a lower physical programming mode, a mixture programming mode or a less layer memory cell mode. In the single layer memory cell mode, one memory cell is only stored with data of one bit. In the lower physical programming mode, only the lower physical programming units are programmed while the upper physical programming units corresponding to the lower physical programming units may not be programmed. In the mixture programming mode, valid data (or real data) are programmed into the lower physical programming units while dummy data is programmed into the upper physical programming units corresponding to the lower physical programming units. In the less layer memory cell mode, one memory cell is stored with data of a first number of bits. For example, the first number may be set to "1".

In this exemplary embodiment, the second programming mode refers to a Multi level cell (MLC) programming mode, a Trinary level cell (TLC) programming mode or other similar modes. In the second programming mode, one memory cell is stored with data of a second number of bits, whereas the second number is equal or greater than "2". For example, the second number may be set to "2" or "3". In another exemplary embodiment, each of the first number and the second number may be other number as long as the second number is greater than the first number.

Figure 7:
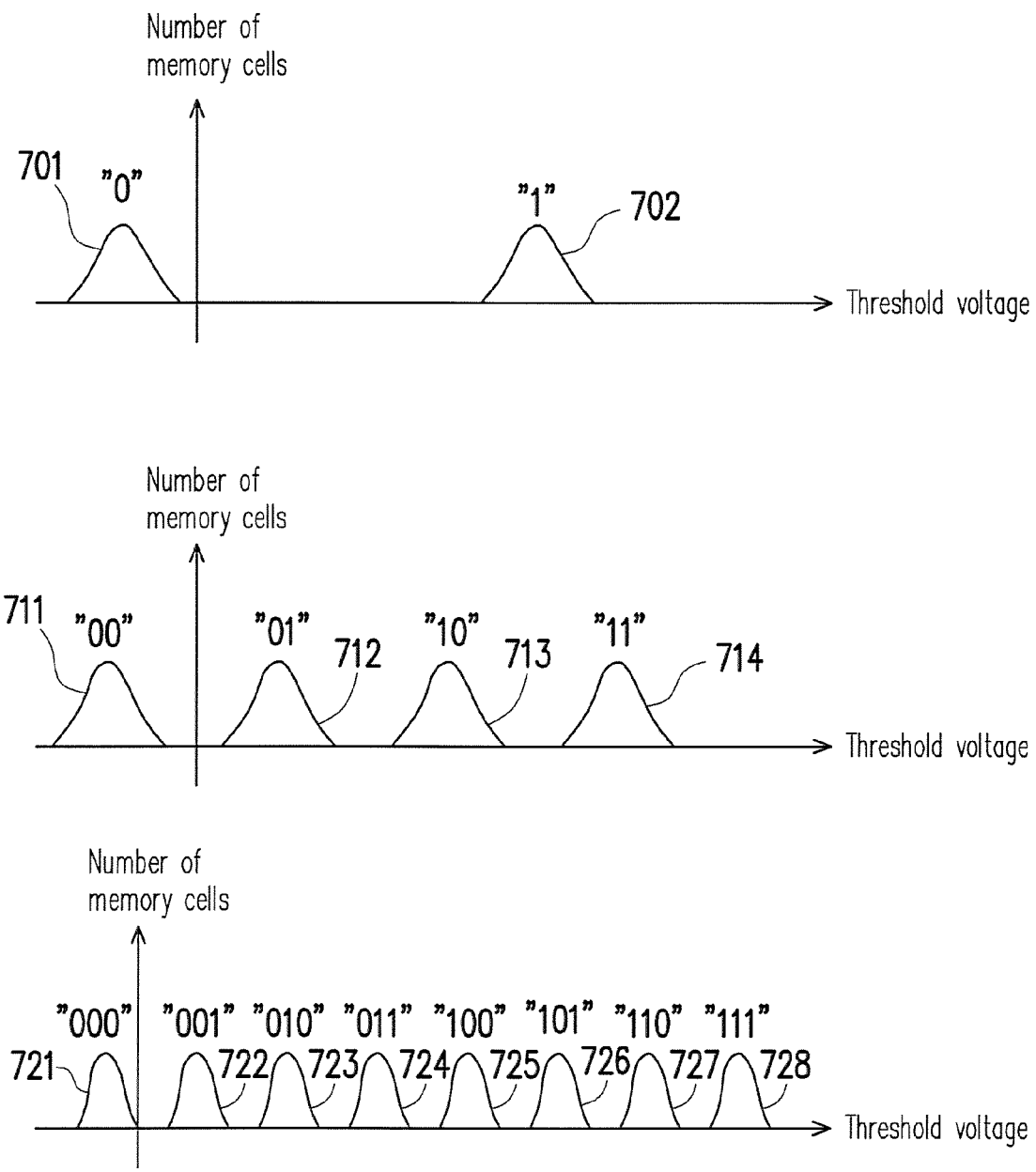
FIG. 7 is a schematic diagram illustrating threshold voltage distributions of the memory cells according to an exemplary embodiment of the invention.

FIG. 7 is a schematic diagram illustrating threshold voltage distributions of the memory cells according to an exemplary embodiment of the invention.

Referring to FIG. 7, in this exemplary embodiment, if the memory cells are programmed based on the first programming mode, the threshold voltage distributions of the programmed memory cells may include distributions 701 and 702. For example, if one specific memory cell is programmed to store a bit of "0", a threshold voltage of that specific memory cell belongs to the distribution 701; and if one specific memory cell is programmed to store a bit of "1", a threshold voltage of that specific memory cell belongs to the distribution 702. However, in another exemplary embodiment, the memory cell with the threshold voltage belonging to the distribution 701 may also be used to store the bit of "1", and the memory cell with the threshold voltage belonging to the distribution 702 may also be used to store the bit of "0". In addition, if the memory cells are programmed based on the second programming mode, the threshold voltage distributions of the programmed memory cells may include distributions 711 to 714 or 721 to 728.

In exemplary embodiment where the second number is "2", if one specific memory cell is programmed to store bits of "00", a threshold voltage of that specific memory cell belongs to the distribution 711; if one specific memory cell is programmed to store bits of "01", a threshold voltage of that specific memory cell belongs to the distribution 712; if one specific memory cell is programmed to store bits of "10", a threshold voltage of that specific memory cell belongs to the distribution 713; and if one specific memory cell is programmed to store bits of "11", a threshold voltage of that specific memory cell belongs to the distribution 714. However, in another exemplary embodiment, the memory cells with the threshold voltages belonging to the distributions 711 to 714 may also be respectively used to store the bits of "11", "10", "01" and "00" or other bit values as long as a total number of bits stored in one memory cell is "2".

In exemplary embodiment where the second number is "3", the memory cells belonging to the distributions 721 to 728 are respectively used to store bits of "000", "001", "010", "011", "100", "101", "110" and "111". However, in another exemplary embodiment, the memory cells with the threshold voltage belonging to the distribution 721 to 728 may also be respectively used to store the bits of "111", "110", "101", "100", "011", "010", "001" and "000" or other bit values as long as a total number of bits stored in one memory cell is "3".

For clear description, in the following exemplary embodiments, a less layer memory cell mode in which each memory cell is stored with 1 bit of data is used as an example for the first programming mode, and a programming mode in which each memory cell is stored with 2 or 3 bits of data is used as an example for the second programming mode. Yet, in other exemplary embodiments, any kind of the first programming mode and the second programming mode may be adopted as long as aforesaid condition is satisfied.

Figure 8:
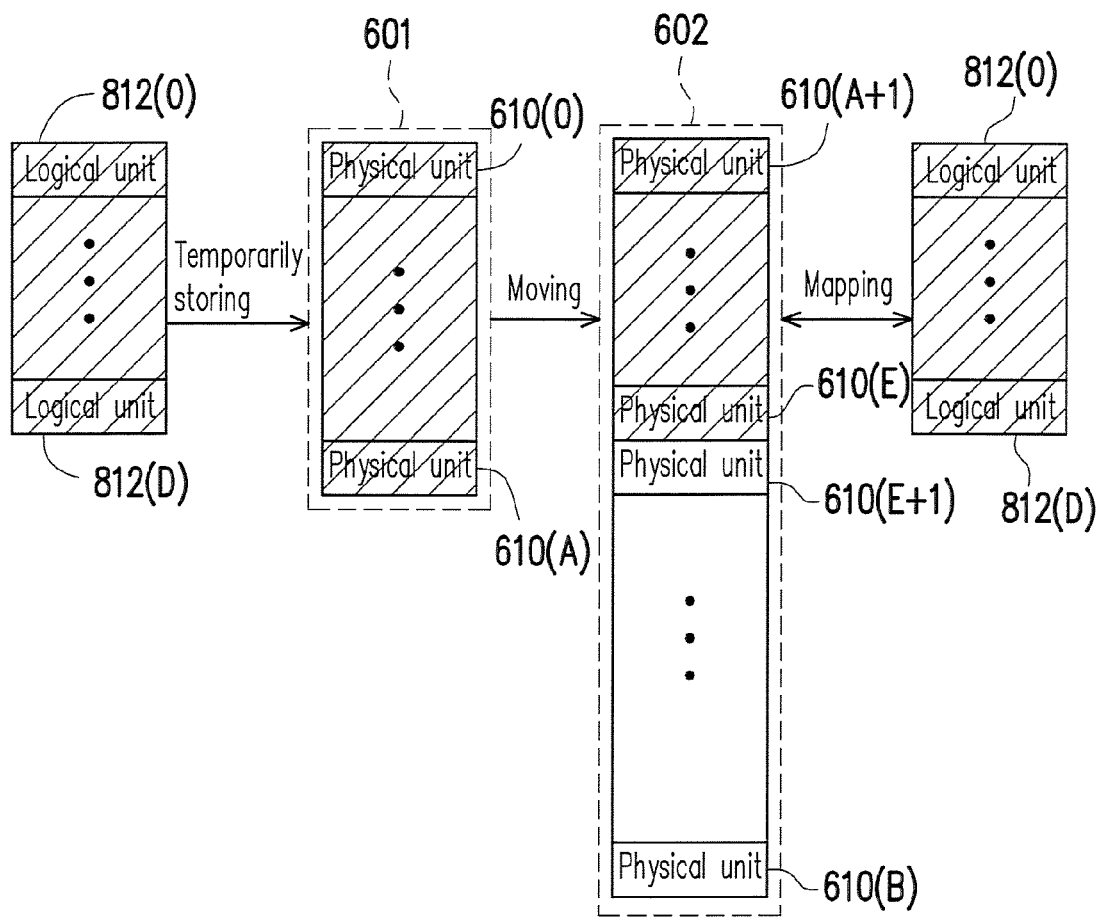
FIG. 8 illustrates a schematic diagram for storing data according to an exemplary embodiment of the invention.

FIG. 8 illustrates a schematic diagram for storing data according to an exemplary embodiment of the invention.

Referring to FIG. 8, when the host system 11 is intended to store data, the host system 11 sends a write command to the memory storage device 10. The write command instructs to store the data into one specific logical unit. The data stored in the specific logical unit is regarded as the data belonging to that specific logical unit. According to the write command, the memory management circuit 502 instructs to temporarily store the data belonging to the specific logical unit into the physical unit belonging to the buffer area 601. As shown in FIG. 8, logical units and physical units stored with data are marked by slash lines.

Generally, after the physical units 610(0) to 610(A) belonging to the buffer area 601 are fully written or used up, the data temporarily stored in the buffer area 601 is moved into the storage area 602. Addresses of the physical units in the storage area 602 for storing the data are regarded as final (or actually) storage addresses of the data and mapped to the logical units to which the data belongs. For example, if it is assumed that the data stored in the physical units 610(0) to 610(A) belongs to logical units 812(0) to 812(D), after the data is moved from the physical units 610(0) to 610(A) belonging to the buffer area 601 into the physical units 610(A+1) to 610(E) belonging to the storage area 602, the logical units 812(0) to 812(D) are mapped to the physical units 610(A+1) to 610(E), as shown in FIG. 8. Herein, the logical units 812(0) to 812(D) are, for example, included by the logical units 612(0) to 612(C) of FIG. 6.

In this exemplary embodiment, each of the memory cells belonging to the buffer area 601 is configured to store the first number of bits, and each of the memory cells belonging to the storage area 602 may be configured to store the second number of bits. In the operation of moving the data from the buffer area 601 into the storage area 602, the data originally stored in a greater number of the memory cells or physical units is moved to a less number of the memory cells or the physical units for finally storage. For example, in an exemplary embodiment where the first number is "1" and the second number is "2", the data temporarily stored in two memory cells (or physical units) belonging to the buffer area 601 may be moved and stored together into one memory cell (or physical unit) of the storage area 602. In an exemplary embodiment where the first number is "1" and the second number is "3", the data temporarily stored in three memory cells (or physical units) belonging to the buffer area 601 may be moved and stored together into one memory cell (or physical unit) of the storage area 602. As such, based on the different programming modes, the data from the host system 11 may be temporarily stored into the buffer area 601 with a faster storing speed in order to rapidly reply the host system 11 that the data has been stored, and the data may be moved later at back end (in the background) with slower speed.

However, in some cases, if the physical units 610(0) to 610(A) belonging to the buffer area 601 are fully written, the data from the host system 11 may be directly stored into the storage area 602 while physical units in the buffer area 601 are skipped. For example, after receiving data (hereinafter, also known as first data) from the host system 11, the memory management circuit 502 determines whether the first physical units (i.e., the physical units 610(0) to 610(A)) belonging to the buffer area 601 is fully written. In this exemplary embodiment, the first physical units belonging to the buffer area 601 being fully written means that there are no extra physical units (or free space) in the buffer area 601 can be used for temporarily storing data (e.g., at least one part of the first data) from the host system 11 unless at least part of data is moved or removed from the buffer area 601. Alternatively, in another exemplary embodiment, the first physical units belonging to the buffer area 601 being fully written may also be regarded as all of the first physical units belonging to the buffer area 601 being used up.

When the first physical units belonging to the buffer area 601 are fully written, the data temporarily stored in the first physical units may include valid data and invalid data. Herein, the valid data is current data belonging to at least one specific logical unit, and the invalid data is not current data belonging to any logical unit. For example, if the host system 11 stores new data into one specific logical unit so that old data originally stored in that specific logical unit is overwritten (i.e., the data belonging to that specific logical unit is updated), the new data temporarily stored in the buffer area 601 is the current data belonging to that specific logical unit and marked as the valid data, whereas the old data being overwritten may still be stored in the buffer area 601 but marked as the invalid data. In an exemplary embodiment, if data belonging to one specific logical unit is updated, a mapping relation between that specific logical unit and the physical unit stored with the old data belonging to that specific logical unit is removed, and a mapping relation between that specific logical unit and the physical unit stored with the current data belonging to that specific logical unit is established. Alternatively, in another exemplary embodiment, if data belonging to one specific logical unit is updated, a mapping relation between that specific logical unit and the physical unit stored with the old data belonging to that specific logical unit may still be maintained depending on practical requirements. In addition, the current data (or the valid data) belonging to one specific logical unit may also be regarded as latest data belonging to that specific logical unit.

If it is determined that the first physical units are fully written, the memory management circuit 502 further determines whether specific data stored in the first physical units matches a preset condition. In an exemplary embodiment, said specific data at least includes second data stored in the first physical units. For example, the second data is current data (i.e., the valid data) belonging to at least one logical unit (hereinafter, known as a first logical unit). In another exemplary embodiment, the second data is all data stored in the first physical units. If it is determined that the second data matches the preset condition, the memory management circuit 502 selects at least one physical unit from the second physical units (i.e., the physical units 610(A+1) to 610(B)) belonging to the storage area 602. Thereafter, the memory management circuit 502 programs the selected physical unit based on the first programming mode to store the at least one part of data of the first data.

In other words, in an exemplary embodiment, if all the physical units belonging to the buffer area 601 are fully written and a distribution of the valid data temporarily stored in the buffer area 601 matches a preset condition, some of the physical units in the storage area 602 initially configured to be programmed based on the second programming mode are changed to be programmed based on the first programming mode in order to store data unable to be rapidly written into the buffer area 601. Accordingly, even if aforesaid at least one part of the first data is directly stored into the storage area 602 while skipping the buffer area 601, aforesaid data is stilled stored based on the first programming mode which is identical to the programming mode for the buffer area 601, and thus the storing speed of aforesaid data is still maintained as identical to the speed for temporarily storing the data into the buffer area 601.

In this exemplary embodiment, the memory management circuit 502 determines whether a data quantity of the second data is equal to a preset data quantity. The preset data quantity may be set in correspondence to a data quantity of all the data that the buffer area 601 can store (i.e., a total capacity of the buffer area 601). For example, if the data quantity of all the data that the buffer area 601 can store is 5 GB, the preset data quantity may be set to 1 GB. In another exemplary embodiment, the preset data quantity may also be set or adjusted according to practical requirements. If the data quantity of the second data is equal to the preset data quantity, the memory management circuit 502 determines that the second data matches the preset condition and execute aforesaid operation of selecting at least one of the second physical units belonging to the storage area 602 and programming the selected physical unit based on the first programming mode. It is worth mentioning that, in an exemplary embodiment, aforesaid operation of determining whether the data quantity of the second data matches the preset data quantity may also include determining whether the data quantity of the second data is less than the preset data quantity. Therefore, the data quantity of the second data determined to be either less than or equal to the preset data quantity may all be considered as though the second data matches the preset condition.

In an exemplary embodiment, if it is determined that the second data does not match the preset condition (e.g., the data quantity of the second data is greater than the preset data quantity), the memory management circuit 502 stores the data by executing a standard procedure. For example, since the buffer area 601 is fully written, the memory management circuit 502 moves at least a part of data from the first physical units belonging to the buffer area 601 into the second physical units belonging to the storage area 602. Thereafter, the memory management circuit 502 erases at least one of the first physical units not stored with the valid data and then stores the at least one part of the first data into the erased first physical units.

In an exemplary embodiment, the preset data quantity may also be set according to a data quantity of the first data. For example, the preset data quantity may be set equal to a total data quantity of the first data. Accordingly, in certain memory speed testing procedures, if a data size of the written data (i.e., the first data) each time is fixed, the writing speed for writing subsequent data can still be maintained even if the buffer area 601 is fully written. In an exemplary embodiment, the preset data quantity may also be set according to related information of both the total capacity of the buffer area 601 and the total data quantity (e.g., data size) of the first data.

Figure 9:
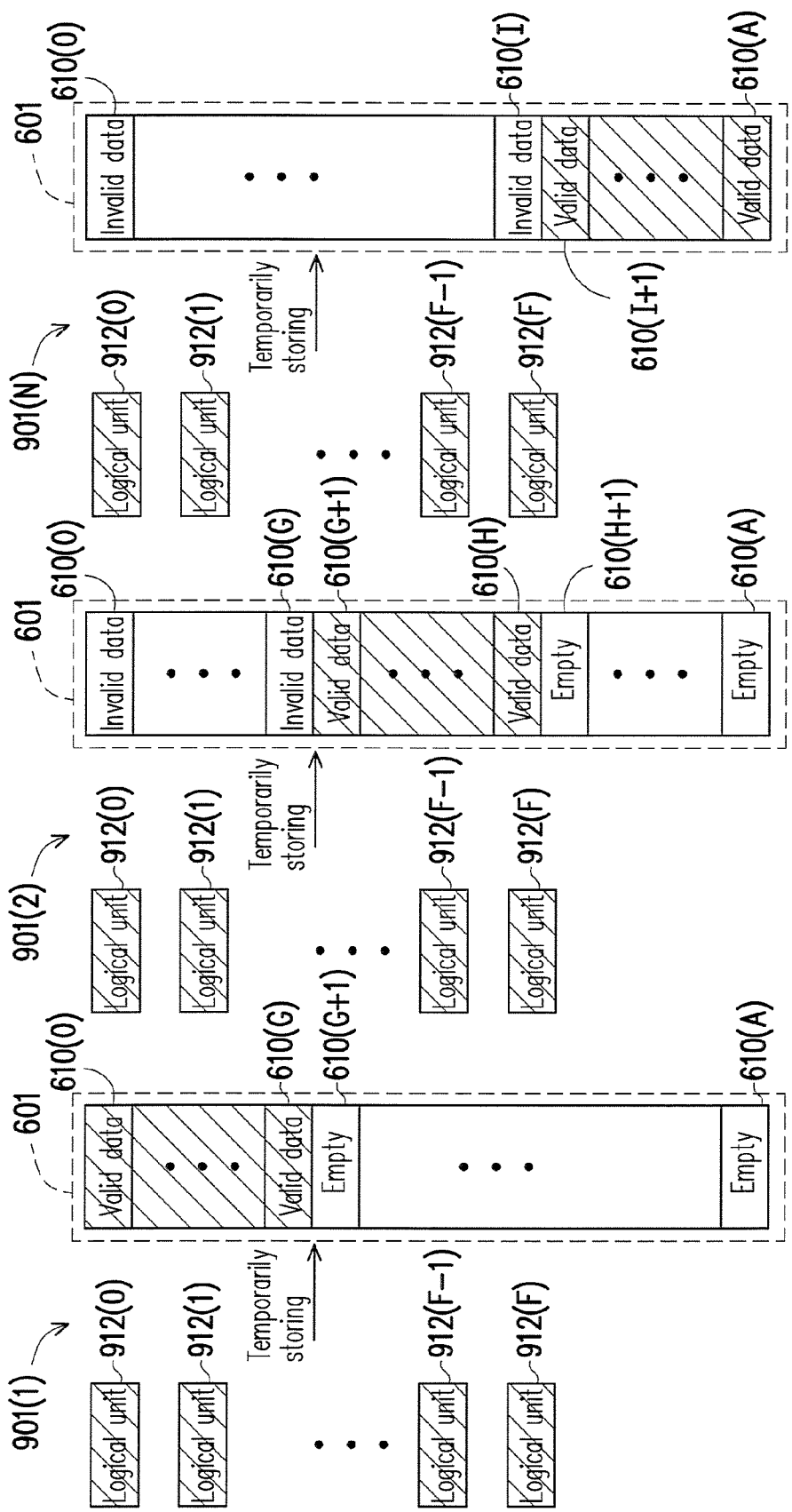
FIG. 9 and FIG. 10 illustrate schematic diagrams for storing data by changing the programming modes according to an exemplary embodiment of the invention.
Figure 10:
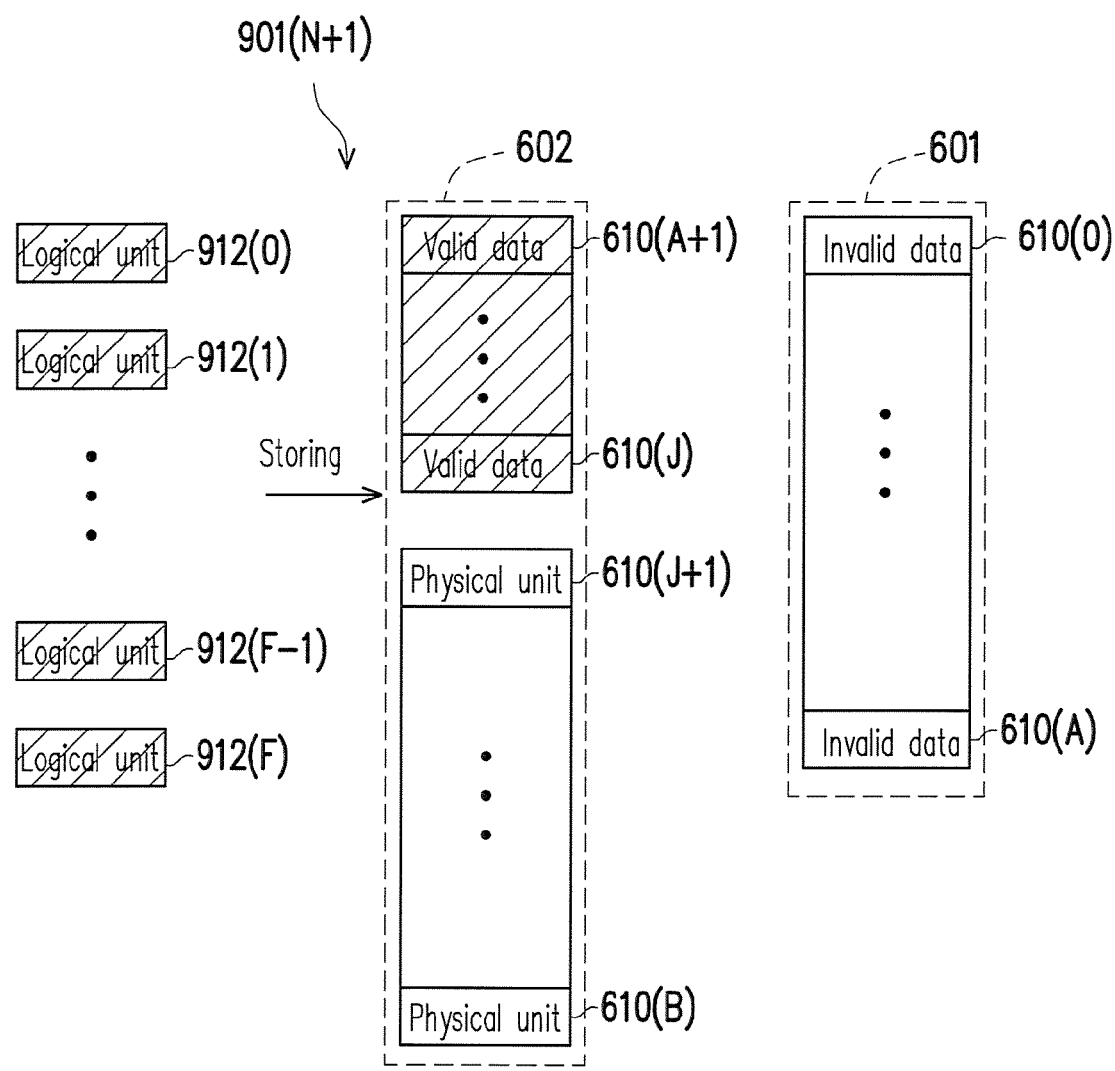

FIG. 9 and FIG. 10 illustrate schematic diagrams for storing data by changing the programming modes according to an exemplary embodiment of the invention.

Referring to FIG. 9, the host system 11 sends a write command (hereinafter, also known as a first write command) which instructs to store data into logical units 912(0) to 912(F). According to the first write command, a writing procedure 901(1) is executed. For example, in the writing procedure 901(1), the data (i.e., write data corresponding to the first write command) belonging to the logical units 912(0) to 912(F) is temporarily stored into the physical unit 610(0) to 610(G) belonging to the buffer area 601 and marked as the valid data. Thereafter, the host system 11 sends another write command (hereinafter, also known as a second write command) which instructs to store another data into logical units 912(0) to 912(F). According to the second write command, a writing procedure 901(2) is executed. For example, in the writing procedure 901(2), the data (i.e., write data corresponding to the second write command) belonging to the logical units 912(0) to 912(F) is temporarily stored into the physical unit 610(G+1) to 610(H) belonging to the buffer area 601. Meanwhile, since the data belonging to the logical units 912(0) to 912(F) is updated, the data temporarily stored in the physical units 610(0) to 610(G) is marked as the invalid data.

After an $(N-1)^{th}$ writing operation is executed for the logical units 912(0) to 912(F), according to another write command sent by the host system 11 (hereinafter, also known as an $N^{th}$ write command) which instructs to write another data into the logical units 912(0) to 912(F), a writing procedure 901(N) is executed. For example, in the writing procedure 901(N), the data (i.e., write data corresponding to the $N^{th}$ write command) belonging to the logical units 912(0) to 912(F) is temporarily stored into the physical unit 610(I+1) to 610(A) belonging to the buffer area 601 and regarded as the valid data. Meanwhile, the data temporarily stored in the physical units 610(0) to 610(I) is marked as the invalid data because said data also belongs to the logical units 912(0) to 912(F). At this time, all the physical units 610(0) to 610(A) belonging to the buffer area 601 are fully written.

When all the physical units 610(0) to 610(A) belonging to the buffer area 601 are fully written, if the host system 11 sends yet another write command (hereinafter, also known as an $(N+1)^{th}$ write command) which instructs to store another data (i.e., the first data) into the logical units 912(0) to 912(F), the memory management circuit 502 determines whether the second data (i.e., the valid data) stored in the buffer area 601 matches the preset condition.

Referring to FIG. 10, the data quantity of the second data stored in the buffer area 601 is equal to the total capacity of the logical units 912(0) to 912(F). Accordingly, the memory management circuit 502 selects the physical units 610(A+1) to 610(J) from the storage area 602 and programs the selected physical units 610(A+1) to 610(J) based on the first programming mode in order to store the data (i.e., write data corresponding to the $(N+1)^{th}$ write command) belonging to the logical units 912(0) to 912(F). In other words, in a writing procedure 910(N+1) corresponding to the $(N+1)^{th}$ write command, the data belonging to the logical units 912(0) to 912(F) is directly stored into the physical units 610(A+1) to 610(J) belonging to the storage area 602 and regarded as the valid data; and all the data temporarily stored in the physical units 610(0) to 610(A) is marked as the invalid data because such data also belongs to the logical units 912(0) to 912(F). In addition, the logical units 912(0) to 912(F) are mapped to the physical units 610(A+1) to 610(J).

After storing the data belonging to the logical units 912(0) to 912(F) into the physical units 610(A+1) to 610(J), if the host system 11 is again intended to update the data belonging to the logical units 912(0) to 912(F), since the buffer area 601 is fully written and the buffer area 601 does not include any valid data (i.e., the data quantity of the second data is less than the preset data quantity), the data belonging to the logical units 912(0) to 912(F) may be directly stored into the remaining physical units belonging to the storage area 602 according to aforesaid operations, which are not repeated hereinafter.

In an exemplary embodiment of FIG. 10, when the write data from the host system 11 is stored into the storage area 602 based on the first programming mode, at least one of the physical units 610(0) to 610(A) belonging to the buffer area 601 may be erased. As such, the erased physical unit may be used later for temporarily storing other write data from the host system 11.

In an exemplary embodiment, the operation of determining whether the second data matches the preset condition is executed in correspondence to that the host system 11 is intended to store the first data and the buffer area 601 is fully written. If the buffer area 601 is not fully written when the host system 11 is intended to store the first data, the memory management circuit 502 temporarily stores at least one part of the first data into the buffer area 601 according to the above description until the buffer area 601 is fully written. Thereafter, whether to store the other part of the first data (which is unable to be directly stored into the buffer area 601) into the storage area 602 based on the first programming mode is then considered.

In an exemplary embodiment, the buffer area 601 being fully written as mentioned above refers to the physical units in the buffer area 601 corresponding to a preset capacity being used. Herein, the preset capacity may be less than or equal to the total capacity of the buffer area 601. For example, in an exemplary embodiment of FIG. 9 and FIG. 10, the preset capacity is set as the total capacity of the physical units 610(0) to 610(A), and the used physical units therein may be stored with the valid data and/or the invalid data. Further, in an exemplary embodiment, the preset capacity may be set to a preset percentage of the total capacity of the buffer area 601 (e.g., 70% to 90% of the total capacity of the buffer area 601).

In the foregoing exemplary embodiments, whether the data quantity of the second data being less than or equal to the preset data quantity is served as a reference for determining whether the second data matches the preset condition. However, in another exemplary embodiment, the memory management circuit 502 can also determine whether a ratio of the second data to all data stored in the first physical units belonging to the buffer area 601 is less than or equal to a preset ratio. Accordingly, whether the second data matches the preset condition may be determined by estimation, rather than actually acquiring the data quantity of the second data. For example, a ratio of the valid data to the data stored in one of the first physical units or an average ratio of the valid data to the data stored in multiple of the first physical units may be analyzed to serve as a reference for estimating the ratio of the second data to all the data stored in the first physical units belonging to the buffer area 601.

If the ratio of the second data to all the data stored in the first physical units is less than or equal to the preset ratio, it can be estimated that the data quantity of the second data is less than or equal to the preset data quantity; and if the ratio of the second data to all the data stored in the first physical units is greater than the preset ratio, it can be estimated that the data quantity of the second data is greater than the preset data quantity. In addition, the preset ratio may also be determined according to the total capacity of the buffer area 601 and/or the data size of the first data. For example, if the total capacity of the buffer area 601 is 5 GB and the data size of write data repeatedly stored into the same logical units each time is 1 GB, the preset ratio may be set to ⅕.

In another exemplary embodiment, the memory management circuit 502 may also determine whether a predetermined number of writing operations are repeatedly used to update the data belonging to the same logical unit. The predetermined number may be "2", "3" or more. The predetermined number of writing operations may refer to two or more consecutively or non-consecutively executed writing operations. For example, in another exemplary embodiment of FIG. 9 and FIG. 10, the memory management circuit 502 may determine whether the data belonging to the logical units 912(0) to 912(F) is repeatedly updated in at least two consecutive writing operations (e.g., the writing operations 901(1) and 901(2), the writing operations 901(N) and 901(N+1), and so on). If the data belonging to the same logical unit is repeatedly updated in the at least two consecutive writing operations, as shown by FIG. 9 and FIG. 10, the memory management circuit 502 can also determine that the second data matches the preset condition and directly store the data (which is unable to be stored into the buffer area 601) into the storage area 602 based on the first programming mode. Conversely, if the consecutively executed writing operations are for different logical units or not used for repeatedly updating the data in one or more specific logical units, it may also be determined that the second data does not match the preset condition so that a standard procedure may be executed accordingly.

In another exemplary embodiment, the memory management circuit 502 may also determine whether a total number of the logical units to which the first data belongs is not greater than a preset value. Taking FIG. 9 and FIG. 10 for example in which the preset value is assumed to be "F+1", when storing the first data belonging to the logical units 912(0) to 912(F), the memory management circuit 502 can determine that the second data matches the preset condition according to the total number of the logical units 912(0) to 912(F) to which the first data belongs being equal to the preset value. Conversely, if the total number of the logical units to which the first data belongs is greater than the preset value, the memory management circuit 502 can determine that the second data does not match the preset condition. In an exemplary embodiment, the preset value may be set according to a total number of the logical units to which the second data stored in the buffer area 601 belongs. For example, in an exemplary embodiment of FIG. 9 and FIG. 10, the preset value may be set to "F+1" according to a total number of the logical units 912(0) to 912(F).

In another exemplary embodiment, the memory management circuit 502 may also determine whether a total number of logical units to which data stored in the first physical units belongs is not greater than another preset value. For example, aforesaid data may refer to the valid data, invalid data or a combination thereof. For example, if the memory management circuit 502 determines that the total number of the logical units to which the data stored in the first physical units belongs is not greater than the another preset value, the memory management circuit 502 determines that the second data matches the preset condition. Alternatively, if the memory management circuit 502 determines that the total number of the logical units to which the data stored in the first physical units belongs is greater than the another preset value, the memory management circuit 502 determines that the second data does not match the preset condition. In an exemplary embodiment, the another preset value may be set according to the total number of the logical units to which the first data belongs. For example, the another preset value may be set to equal to the total number of the logical units to which the first data belongs.

In an exemplary embodiment, any one of various aforementioned operations for determining whether the second data matches the preset condition above may be selectively used. Alternatively, in another exemplary embodiment, a part or all of various aforementioned operations for determining whether the second data matches the preset condition may be used together, so as to enhance accuracy of the determination.

In an exemplary embodiment, the memory management circuit 502 limits a total number of the second physical units in the storage area 602 able to be programmed based on the first programming mode not to be greater than a preset number. Accordingly, it can prevent an excessive number of physical units initially configured to be programmed based on the second programming mode from being changed to be programmed based on the first programming mode. For example, in an exemplary embodiment where the second number is "3", if the total capacity of the buffer area 601 is 5 GB and the data size of the write data repeatedly stored into the same logical unit each time is 1 GB, at most a M number of physical units of the storage area 602 are configured to be able to be stored with data based on the first programming mode at the same time. Herein, if the M number of physical units are programmed by the initially configured second programming mode, the total capacity of the M number of physical units is 9 GB; and if the M number of physical units are changed to be programmed by the first programming mode, the total capacity of the M number of physical units becomes 3 GB. Nonetheless, various setting values as mentioned above are merely examples, which may be adjusted based on practical requirements.

In an exemplary embodiment, if one specific physical unit in the storage area 602 changed to be programmed based on the first programming mode in response to aforesaid operations is erased, that specific physical unit is then restored to be programmed based on the initially configured second programming mode. In other words, such physical unit will still be initially configured, in the future, to be programmed based on the second programming mode, so as to store the data moved from the buffer area 601.

In an exemplary embodiment, each time the physical unit selected from the storage area 602 to be programmed based on the first programming mode is randomly selected from empty (or spare) physical units. However, in another exemplary embodiment, the physical unit selected from the storage area 602 to be programmed based on the first programming mode may also be selected according to a specific filter condition. For example, the physical unit selected from the storage area 602 to be programmed based on the first programming mode may be selected according to information such as an erase count, a write count, a read count and/or a bit error rate of at least a part of the physical units in the storage area 602.

Figure 11:
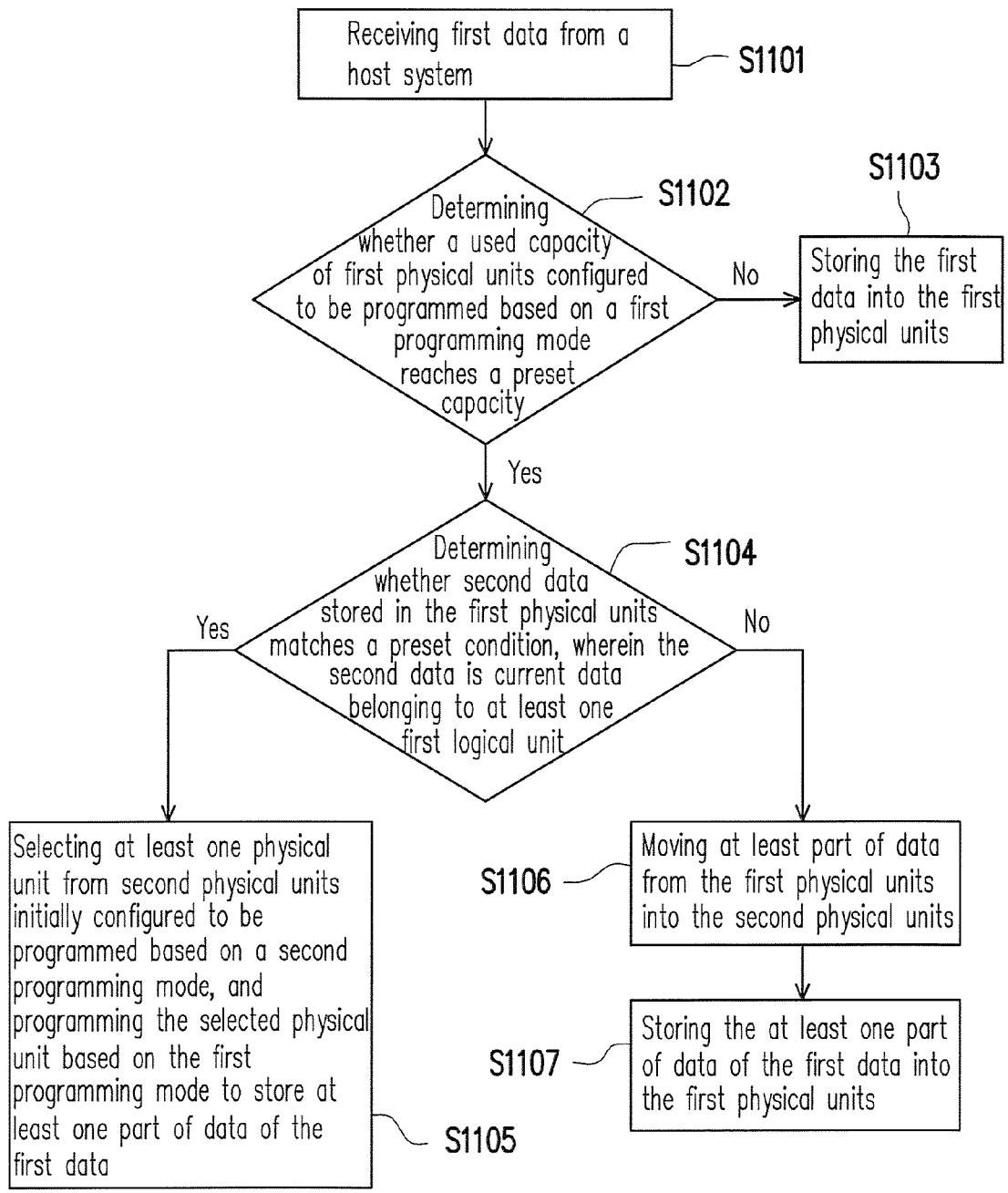
FIG. 11 is a flowchart illustrating a data programming method according to an exemplary embodiment of the invention.

FIG. 11 is a flowchart illustrating a data programming method according to an exemplary embodiment of the invention.

Referring to FIG. 11, in step S1101, first data is received from a host system. In step S1102, whether a used capacity of first physical units configured initially (or only) to be programmed based on a first programming mode reaches a preset capacity is determined. If the used capacity of the first physical units does not reach the preset capacity, in step S1103, the first data is stored into the first physical units. If the used capacity of the first physical units reaches the preset capacity, in step S1104, whether (at least) second data stored in the first physical units matches a preset condition is determined. Herein, the second data is current data (i.e., valid data) belonging to at least one first logical unit. If the second data matches the preset condition, in step S1105, at least one physical unit is selected from second physical units initially configured to be programmed based on a second programming mode, and the selected physical unit is programmed based on the first programming mode to store at least one part of data of the first data. Accordingly, even if the used physical units in the first physical units with the faster writing speed reaches a preset level (e.g., the first physical units are fully written), other data (which is unable to be written into the first physical units) may be directly stored into the second physical units with the identical or similar writing speed. Further, if the second data does not match the preset condition, it indicates that the current writing speed may not need to be deliberately controlled. Therefore, in step S1106, at least part of data is moved from the used first physical units into the second physical units and at least part of the first physical units is erased. Thereafter, in step S1107, the at least one part of data of the first data is stored into the erased first physical units.

Nevertheless, steps depicted in FIG. 11 are described in detail as above so that related description thereof is omitted hereinafter. It should be noted that, the steps depicted in FIG. 11 may be implemented as a plurality of program codes or circuits, which are not particularly limited in the invention. Moreover, the method disclosed in FIG. 11 may be implemented by reference with above exemplary embodiments, or may be implemented separately, which are not particularly limited in the invention.

In summary, if the used capacity of the first physical units configured to be programmed based on the first programming mode reaches the preset capacity and the specific data stored in the first physical units matches the preset condition, at least one physical unit may be selected from the physical units initially configured to be programmed based on the second programming mode and changed to be programmed based on the first programming mode to store the data from the host system. Accordingly, the decrease of a writing speed may be improved when a buffer area of a rewritable non-volatile memory module is fully written. In an exemplary embodiment, a testing mode of random write which uses non-consecutive logical addresses may also be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data programming method for a rewritable non-volatile memory module, wherein the rewritable non-volatile memory module comprises a plurality of physical units, wherein the physical units comprise a plurality of first physical units and a plurality of second physical units, wherein the data programming method comprises:
configuring, initially, the first physical units to be programmed based on a first programming mode and the second physical units to be programmed based on a second programming mode;
receiving first data from a host system;
determining whether a used capacity of the first physical units reaches a preset capacity;
determining whether at least second data stored in the first physical units matches a preset condition if the used capacity of the first physical units reaches the preset capacity, wherein the second data is valid data belonging to at least one first logical unit; and
selecting at least one physical unit from the second physical units and programming the selected physical unit based on the first programming mode to store at least one part of the first data if the second data matches the preset condition.

2. The data programming method of claim 1, wherein the second data is all valid data in the first physical units.

3. The data programming method of claim 1, wherein the step of determining whether at least the second data stored in the first physical units matches the preset condition comprises:
determining whether a data quantity of the second data is less than or equal to a preset data quantity.

4. The data programming method of claim 3, wherein the preset data quantity is equal to a total data quantity of the first data.

5. The data programming method of claim 1, wherein the step of determining whether at least the second data stored in the first physical units matches the preset condition comprises:
determining whether a ratio of the second data to all data stored in the first physical units is less than or equal to a preset ratio.

6. The data programming method of claim 1, wherein the step of determining whether at least the second data stored in the first physical units matches the preset condition comprises:
determining whether a total number of logical units to which the data in the first physical units belongs is not greater than a preset value.

7. The data programming method of claim 1, wherein the step of determining whether at least the second data stored in the first physical units matches the preset condition comprises:
determining whether data belonging to the at least one logical unit is repeatedly updated in a predetermined number of writing operations.

8. The data programming method of claim 1, further comprising:
mapping at least one second logical unit to the selected physical unit after programming the selected physical unit based on the first programming mode to store the at least one part of the first data.

9. The data programming method of claim 1, wherein a total number of the physical units in the second physical units able to be programmed based on the first programming mode is limited to be less than a preset number.

10. The data programming method of claim 1, further comprising:
moving at least one part of data from the first physical units into the second physical units if the second data does not match the preset condition; and
storing the at least one part of the first data into the first physical units after the at least one part of data is moved from the first physical units into the second physical units.

11. The data programming method of claim 1, wherein data of a first number of bits is stored into one memory cell in the physical units if the memory cell is programmed based on the first programming mode,
wherein data of a second number of bits is stored into the memory cell if the memory cell is programmed based on the second programming mode,
wherein the first number is less than the second number.

12. A memory storage device, comprising:
a connection interface unit, configured to couple to a host system;
a rewritable non-volatile memory module, wherein the rewritable non-volatile memory module comprises a plurality of physical units, wherein the physical units comprise a plurality of first physical units and a plurality of second physical units; and
a memory control circuit unit, coupled to the connection interface unit and the rewritable non-volatile memory module,
wherein the memory control circuit unit is configured to initially configure the first physical units to be programmed based on a first programming mode and the second physical units to be programmed based on a second programming mode,
wherein the memory control circuit unit is further configured to receive first data from the host system,
wherein the memory control circuit unit is further configured to determine whether a used capacity of the first physical units reaches a preset capacity,
wherein the memory control circuit unit is further configured to determine whether at least second data stored in the first physical units matches a preset condition if the used capacity of the first physical units reaches the preset capacity, wherein the second data is valid data belonging to at least one first logical unit,
wherein the memory control circuit unit is further configured to select at least one physical unit from the second physical units and send a write command sequence which instructs to program the selected physical unit based on the first programming mode to store at least one part of the first data if the second data matches the preset condition.

13. The memory storage device of claim 12, wherein the second data is all valid data in the first physical units.

14. The memory storage device of claim 12, wherein the operation of determining whether at least the second data stored in the first physical units matches the preset condition by the memory control circuit unit comprises:
  determining whether a data quantity of the second data is less than or equal to a preset data quantity.

15. The memory storage device of claim 14, wherein the preset data quantity is equal to a total data quantity of the first data.

16. The memory storage device of claim 12, wherein the operation of determining whether at least the second data stored in the first physical units matches the preset condition by the memory control circuit unit comprises:
  determining whether a ratio of the second data to all data stored in the first physical units is less than or equal to a preset ratio.

17. The memory storage device of claim 12, wherein the operation of determining whether at least the second data stored in the first physical units matches the preset condition by the memory control circuit unit comprises:
  determining whether a total number of logical units to which the data in the first physical units belongs is not greater than a preset value.

18. The memory storage device of claim 12, wherein the operation of determining whether at least the second data stored in the first physical units matches the preset condition by the memory control circuit unit comprises:
  determining whether data belonging to the at least one first logical unit is repeatedly updated in a predetermined number of writing operations.

19. The memory storage device of claim 12, wherein the memory control circuit unit is further configured to map at least one second logical unit to the selected physical unit after the selected physical unit is programmed based on the first programming mode to store the at least one part of the first data.

20. The memory storage device of claim 12, wherein a total number of the physical units in the second physical units able to be programmed based on the first programming mode is limited to be less than a preset number.

21. The memory storage device of claim 12, wherein the memory control circuit unit is further configured to move at least one part of data from the first physical units into the second physical units if the second data does not match the preset condition,
  wherein the memory control circuit unit is further configured to store the at least one part of the first data into the first physical units after the at least one part of data is moved from the first physical units into the second physical units.

22. The memory storage device of claim 12, wherein data of a first number of bits is stored into one memory cell in the physical units if the memory cell is programmed based on the first programming mode,
  wherein data of a second number of bits is stored into the memory cell if the memory cell is programmed based on the second programming mode,
  wherein the first number is less than the second number.

23. A memory control circuit unit, for controlling a rewritable non-volatile memory module, wherein the rewritable non-volatile memory module comprises a plurality of physical units, wherein the physical units comprise a plurality of first physical units and a plurality of second physical units, wherein the memory control circuit unit comprises:
  a host interface, configured to couple to a host system;
  a memory interface, configured to couple to the rewritable non-volatile memory module; and
  a memory management circuit, coupled to the host interface and the memory interface,
  wherein the memory management circuit is configured to initially configure the first physical units to be programmed based on a first programming mode and the second physical units to be programmed based on a second programming mode,
  wherein the memory management circuit is further configured to receive first data from the host system,
  wherein the memory management circuit is further configured to determine whether a used capacity of the first physical units reaches a preset capacity,
  wherein the memory management circuit is further configured to determine whether at least second data stored in the first physical units matches a preset condition if the used capacity of the first physical units reaches the preset capacity, wherein the second data is valid data belonging to at least one first logical unit,
  wherein the memory management circuit is further configured to select at least one physical unit from the second physical units and send a write command sequence which instructs to program the selected physical unit based on the first programming mode to store at least one part of the first data if the second data matches the preset condition.

24. The memory control circuit unit of claim 23, wherein the second data is all valid data in the first physical units.

25. The memory control circuit unit of claim 23, wherein the operation of determining whether at least the second data stored in the first physical units matches the preset condition by the memory management circuit comprises:
  determining whether a data quantity of the second data is less than or equal to a preset data quantity.

26. The memory control circuit unit of claim 25, wherein the preset data quantity is equal to a total data quantity of the first data.

27. The memory control circuit unit of claim 23, wherein the operation of determining whether at least the second data stored in the first physical units matches the preset condition by the memory management circuit comprises:
  determining whether a ratio of the second data to all data stored in the first physical units is less than or equal to a preset ratio.

28. The memory control circuit unit of claim 23, wherein the operation of determining whether at least the second data stored in the first physical units matches the preset condition by the memory management circuit comprises:
  determining whether a total number of logical units to which the data in the first physical units belongs is not greater than a preset value.

29. The memory control circuit unit of claim 23, wherein the operation of determining whether at least the second data stored in the first physical units matches the preset condition by the memory management circuit comprises:
  determining whether data belonging to the at least one logical unit is repeatedly updated in a predetermined number of writing operations.

30. The memory control circuit unit of claim 23, wherein the memory management circuit is further configured to map at least one second logical unit to the selected physical unit after the selected physical unit is programmed based on the first programming mode to store the at least one part of the first data.

31. The memory control circuit unit of claim 23, wherein a total number of the physical units in the second physical units able to be programmed based on the first programming mode is limited to be less than a preset number.

32. The memory control circuit unit of claim 23, wherein the memory management circuit is further configured to move at least part of data from the first physical units into the second physical units if the second data does not match the preset condition, wherein the memory management circuit is further configured to store the at least one part of data of the first data into the first physical units after the at least part of data is moved from the first physical units into the second physical units.

33. The memory control circuit unit of claim 23, wherein data of a first number of bits is stored into one memory cell in the physical units if the memory cell is programmed based on the first programming mode, wherein data of a second number of bits is stored into the memory cell if the memory cell is programmed based on the second programming mode, wherein the first number is less than the second number.

* * * * *